Nov. 10, 1970 C. Z. LEINKRAM ET AL 3,538,597

FLATPACK LID AND METHOD

Filed July 13, 1967

INVENTORS
CHARLES Z. LEINKRAM
MICHAEL A. SHIMKUS
BY Melvin L. Crane AGENT
[signature] ATTORNEY United States Patent Office 3,538,597

Patented Nov. 10, 1970

3,538,597
FLATPACK LID AND METHOD

Charles Z. Leinkram, Bowie, and Michael A. Shimkus, Ellicott City, Md., assignors to the United States of America as represented by the Secretary of the Navy Filed July 13, 1967, Ser. No. 653,282
Int. Cl. B01j *17/00;* H01j *7/02*
U.S. Cl. 29—588 2 Claims

ABSTRACT OF THE DISCLOSURE

This invention is directed to a method of securing an economical cover to a package which may contain integrated circuits as well as other microelectronic systems. The cover may be formed from a strip of Kovar or other metal with a solder cladding and then applied to the package at a temperature of about 200 degrees centigrade. Such a cover encloses the microelectronic elements within a housing for protection thereof.

The invention described herein may be manufactured and used by or for the Government of the United States of America for governmental purposes without the payment of any royalties thereon or therefor.

This invention is directed to a method and apparatus for economically packaging integrated circuits and other microelectronic systems in a protective package and more particularly to an economical cover and to a method of securing the cover of the package.

Heretofore the utilization of the microelectronics art to fabricate microelectronic systems and functions have been carried out through use of small packages known as a flat pack. The flat pack encloses the electrical components for protection of the various components therein to prevent damage from handling as well as atmospheric and other conditions. These packages are very small and by use of microelectronic systems includes various components of a circuit within one package. In packaging components. The housing is formed as a flat pack without a cover thereon. The microelectronic components are placed in the flat pack, connected electrically to leads extending through the walls of the housing and then the cover is placed thereon. Heretofore either a metalized ceramic or gold-plated Kovar cover and a solder preform usually composed of a gold-silicon eutectic alloy or a gold-tin alloy is used to enclose the package. The cover or lids and the solder preform are rather expensive thereby introducing high cost in packaging. Also, it has been determined that the lid-solder preform construction have their draw backs particularly in the formation of "purple plague." (Purple plague is an expansive and brittle gold-aluminum intermetallic compound ($AuAl_2$) which often forms at an interface of a gold-aluminum thermocompression bond and is initiated visually by ambient temperatures in excess of 250° C. This intermetallic appears purple in the crystalline form.) Such flat packs as used in the prior art require temperatures of 300 degrees centigrade or greater during assembly which at times has deleterious effects on the electronic components and also effects the seal between the lid and the body of the flat pack. Such deleterious effects permit the lid to come loose during vibrational as well as other uses. Thus, the electronic components within the flat pack may be harmed by the assembly conditions.

The new cover and method of the present invention encloses the electronic components in the flat pack such that there are no deleterious effects from outside. The cover is rigidly secured to the body of the flat pack at a much lower temperature than the prior art devices to provide a package which overcome the deleterious effects of the prior art flat pack.

It is therefore an object of the present invention to provide a flat pack lid or cover which is inexpensive, easily formed, and easily secured to a flat pack body or housing.

Another object is to provide a lid or cover for a flat pack which adheres rigidly to the body, is not affected by vibrational or other forces and maintains a true hermetic seal while using a soldering temperature below 250° C.

Still another object is to provide a lid or cover and the method of securing the cover to a flat pack which minimizes "purple plague."

Yet another object is to provide a self contained lid with solder thereon which does not require a solder preform to secure the cover to a flat pack.

While still another object is to provide a self contained lid with solder thereon may be secured in a minimum time by relatively inexperienced as well as experienced personnel.

Other objects and advantages of the invention will hereinafter become more fully apparent from the following description of the annexed drawing; wherein, FIG. 1 illustrates a cross sectional view depicting a prior art method of securing a lid to a flat pack;

Figure 1:
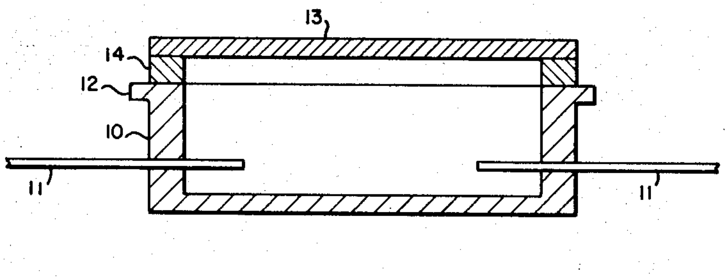
Figure 2:
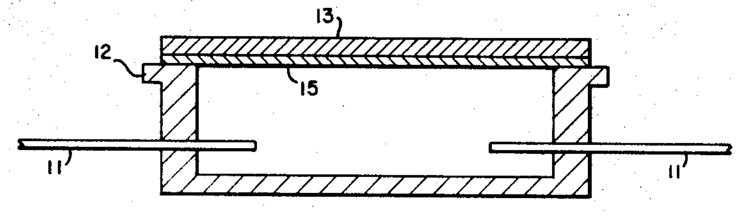
FIG. 2 illustrates a cross sectional view of the method of securing a lid to a flat pack according to the present invention.
Figure 3:
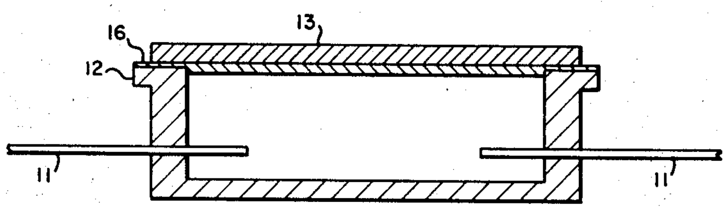
FIG. 3 illustrates a lid secured onto a flat pack according to the present invention.

Now referring to the drawing there is shown in FIGS. 1, 2, and 3 a flat pack housing to which a lid is secured. FIG. 1 illustrates the method as depicted by the prior art, FIG. 2 illustrates the method of the present invention and FIG. 3 illustrates a lid of the present invention assembled onto the housing.

A housing 10 of exaggerated size has electrical leads 11 extending through opposite walls to which micro-electronic components are connected. (The micro-electronic components are not shown for clarification of the drawing.)

The upper edge of the housing is provided with a gold-plated lip 12 to which the lid 13 is secured. As shown in the prior art method, illustrated by FIG. 1, a solder preform 14 is placed between the lid 13 and the lip 12 on the body of the housing. The assembly is then heated to a temperature of about 300 degrees centigrade to melt the solder preform thereby securing the lid to the lip of the housing body.

FIG. 2 illustrates the flat-pack of the present invention. The lid 13 is punched from a roll of Kovar to which a thin coating of tin-lead eutectic solder 15 having a thickness of about 0.001 inch has been applied to one side. The lid is placed onto the flat pack of housing body with the solder side adjacent to the gold-plated lip of the body. With the lid in place on the body the combination is heated to a temperature of above 180 degrees centigrade but below 250° C. which softens the solder coating. A pressure or weight is applied to the lid which breaks the surface tension of the solder coating and the residual oxide film in the area of the lip around the body. The solder then wets the surface and flows over the surface of the lip at 16 as shown by FIG. 3 to secure the lid to the upper surface of the flat pack body. The solder over the remaining area of the lid remains on the lid since the surface tension is not broken, thus when the body with the lid in place is cooled, the solder coating cools down and remains in place, except in the areas in which the cover touches the lip portion of the flat pack body.

In order to prevent contamination of the electronic components contained within the flat-pack, the flat-pack housing with the electronic components secured therein may be placed within a vacuum chamber, evacuated, and the lid placed thereon within the vacuum, then the cover is secured in place by heating within the evacuated chamber.

Since the lid of the flat-pack is applied at such a low temperature, "purple plaque" is at a minimum or eliminated completely. Also, by using low heat there is no deleterious effects on the electronic components within the flat pack due to the heat applied during application of the lid.

The solder on one surface of the Kovar lid of the present invention may be applied either by plating or cladding. The solder coating may be formed of a gold-silicon eutectic; however, a tin-lead eutectic is preferred. Since the lid has a coating of solder thereon, the lid may be applied more easily, there is no requirement for a solder preform, the lids may be fabricated of any desired size, by a punch press, from a large sheet or roll of solder cladded Kovar. Also, it will be obvious to others that any low melting (below 250° C.) solder coating of any desired composition may be applied to the Kovar lid.

Flat packs upon which lids according to this invention are placed vary in size for an example ⅜ inch by ¼ inch by 1/16 inch or any other desired size wherein the lid has a thickness of about 10–20 mils. These flat packs are used in microelectronics which is that branch of the electronics art which is associated with extremely small electronic parts, assemblies, or systems.

What is claimed and desired to be secured by Letters Patent of the United States is:

1. A method of preparing and securing a lid onto a flat pack within which integrated circuits and other microelectronic systems have been electrically connected; which comprises, applying a thin coating of tin-lead eutectic solder onto the entire surface area of one surface of a large sheet of material from which a solder clad lid is obtained, fabricating a flat pack lid from a portion of said solder clad sheet of material, placing said solder clad into onto the flatpack, heating the flat pack and lid to a temperature of from above 180° C. and less than 250° C. to make the solder into a molten state, applying a pressure onto said lid to break an oxide film on the molten solder to overcome surface tension of the molten solder thereby causing the solder to flow in the area of contact between said lid and said flat pack, stop applying heat to the flat pack and lid and permitting the assembled flat pack and lid to cool whereby the assembled flat pack and lid is in place and ready for use in an electronic system.

2. A method as claimed in claim 1; wherein, said lid is placed onto said flatpack within an evacuated surrounding; and said flat pack and lid are heated within said evacuated surroundings.

References Cited

UNITED STATES PATENTS

| | | | |
|---|---|---|---|
| 3,072,832 | 1/1963 | Kilby. | |
| 3,202,489 | 8/1965 | Bender | 29—501 X |
| 3,271,625 | 9/1966 | Caracciolo. | |
| 3,292,240 | 12/1966 | McNutt | 29—577 |
| 3,312,771 | 4/1967 | Hessinger. | |
| 3,322,517 | 5/1967 | Miller | 29—197.5 |
| 3,340,602 | 9/1967 | Hontz | 29—588 |
| 3,422,320 | 1/1969 | Woodling | 29—502 |
| 3,383,454 | 5/1968 | Dix | 174—52.5 |
| 3,381,372 | 5/1968 | Capano. | |
| 3,374,537 | 3/1968 | Doelp. | |
| 3,337,678 | 8/1967 | Stelmak | 174—52.5 |
| 3,187,240 | 1/1965 | Clark | 174—50.5 |
| 1,779,884 | 10/1930 | Lange | 113—80 |

OTHER REFERENCES

"Solders and Soldering" by Howard H. Manko, copyright 1964, see pp. 35–45.

CHARLIE T. MOON, Primary Examiner

R. B. LAZARUS, Assistant Examiner

U.S. Cl. X.R.

29—482, 497.5, 589; 174—50.5; 228—56